(12) United States Patent
Hsieh et al.

(10) Patent No.: US 9,406,883 B1
(45) Date of Patent: Aug. 2, 2016

(54) STRUCTURE AND FORMATION METHOD OF MEMORY DEVICE

(71) Applicant: Taiwan Semiconductor Manufacturing Co., Ltd, Hsin-Chu (TW)

(72) Inventors: Ching-Pei Hsieh, Kaohsiung (TW); Chern-Yow Hsu, Chu-Bei (TW); Shih-Chang Liu, Kaohsiung (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/592,380

(22) Filed: Jan. 8, 2015

(51) Int. Cl.
*H01L 45/00* (2006.01)

(52) U.S. Cl.
CPC ........ *H01L 45/1683* (2013.01); *H01L 45/1233* (2013.01); *H01L 45/1273* (2013.01); *H01L 45/146* (2013.01)

(58) Field of Classification Search
CPC .............................. H01L 21/283; H01L 47/00
See application file for complete search history.

(56) References Cited

U.S. PATENT DOCUMENTS

| | | | |
|---|---|---|---|
| 2005/0208718 A1* | 9/2005 | Lim | H01L 28/75 438/240 |
| 2010/0264396 A1* | 10/2010 | Lung | G11C 13/0004 257/3 |
| 2014/0103284 A1* | 4/2014 | Hsueh | H01L 45/1608 257/4 |

* cited by examiner

*Primary Examiner* — Mamadou Diallo
(74) *Attorney, Agent, or Firm* — Birch, Stewart, Kolasch & Birch, LLP

(57) ABSTRACT

Structures and formation methods of a semiconductor device structure are provided. The semiconductor device structure includes a semiconductor substrate and a first electrode over the semiconductor substrate. The first electrode has a ring-shaped cross section. The semiconductor device structure also includes a resistance-switching layer over the first electrode and a second electrode over the resistance-switching layer.

20 Claims, 6 Drawing Sheets

STRUCTURE AND FORMATION METHOD OF MEMORY DEVICE

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

In the integrated circuit (IC) industry, the resistive random access memory (RRAM) device represents an emerging technology for next generation non-volatile memory devices. The RRAM device uses a dielectric material, which although is normally insulating, can be made to conduct through a filament or conduction path formed after application of a specific voltage. Once the filament is formed, it may be set (i.e., re-formed, resulting in a lower resistance across the RRAM device) or reset (i.e., broken, resulting in a high resistance across the RRAM device) by appropriately applied voltages. The low and high resistance states can be utilized to indicate a digital signal of "1" or "0" depending upon the resistance state, and thereby provide a non-volatile memory cell that can store a bit.

However, since feature sizes continue to decrease, fabrication processes continue to become more difficult to perform. Therefore, it is a challenge to form a reliable semiconductor device structure including the RRAM device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
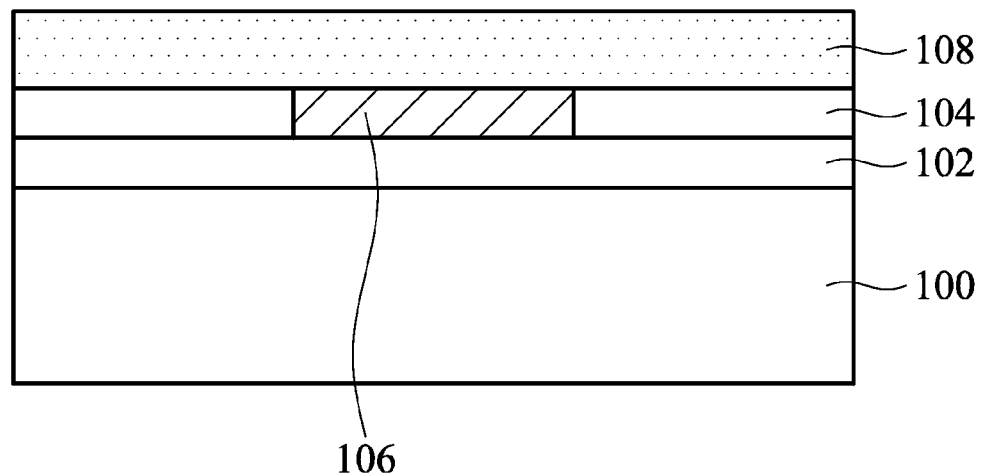
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added in the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, shallow trench isolation (STI) features or local oxidation of semiconductor (LOCOS) features.

Examples of the various device elements that may be formed in the semiconductor substrate 100 include transistors, diodes, another suitable element, or a combination thereof. The transistors may include metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs). Various processes may be performed to form the various device elements. The processes include, for example, deposition, photolithography, etching, implantation, annealing, planarization, another applicable process, or a combination thereof.

As shown in FIG. 1A, an interconnect structure 102 is formed over the semiconductor substrate 100, in accordance with some embodiments. The interconnect structure 102 forms electrical routes to the device elements formed in and/or on the semiconductor substrate 100. The interconnect structure 102 includes one or more dielectric layers and multiple conductive features. The dielectric layers surround the conductive features. The conductive features include, for example, conductive lines that provide electrical paths in horizontal directions and conductive vias that provide electrical paths in vertical directions. Multiple processes may be used to form the interconnect structure 102. These processes may include deposition, photolithography, etching, planarization, another applicable process, or a combination thereof.

As shown in FIG. 1A, an interconnect structure which includes a dielectric layer 104 and a conductive feature 106 is formed over the interconnect structure 102, in accordance with some embodiments. In some embodiments, the conductive feature 106 is a conductive line. The conductive feature 106 is electrically connected to one of the device elements formed in and/or on the semiconductor substrate 100 through one or more conductive features formed in the interconnect structure 102. For example, the conductive feature 106 may be electrically connected to a drain region of a transistor formed in and/or on the semiconductor substrate 100.

In some embodiments, the dielectric layer 104 is made of silicon oxide, borosilicate glass (BSG), phosphoric silicate glass (PSG), borophosphosilicate glass (BPSG), fluorinated silicate glass (FSG), porous dielectric material, another suitable low-k dielectric material, or a combination thereof. The conductive feature 106 may be made of copper, aluminum, tungsten, cobalt, gold, platinum, titanium, another suitable conductive material, or a combination thereof. Similarly, various processes, including deposition, etching, planarization, or the like, may be used to form the dielectric layer 104 and the conductive feature 106.

Afterwards, a dielectric layer 108 is deposited over the dielectric layer 104 and the conductive feature 106, as shown in FIG. 1A in accordance with some embodiments. The dielectric layer 104 is used to electrically isolate an electrode to be formed therein from another conductive element. The dielectric layer 104 may also be used as a stop layer during subsequent planarization and/or etching processes. In some embodiments, the dielectric layer 104 is made of a dielectric material that is substantially free of oxygen. In other words, the dielectric layer 108 contains substantially no oxygen. However, it should be appreciated that embodiments of the disclosure are not limited thereto. In some other embodiments, the dielectric layer 108 contains oxygen. For example, the dielectric layer 108 includes silicon oxide.

The dielectric layer 108 may be made of silicon carbide, silicon nitride, silicon carbon nitride, another suitable material, or a combination thereof. Various deposition methods may be used to deposit the dielectric layer 108. The dielectric layer 108 may be deposited using a chemical vapor deposition (CVD) process, an atomic layer deposition (ALD) process, a spin-on process, a physical vapor deposition (PVD) process, a plating process, another applicable process, or a combination thereof.

Figure 1B:
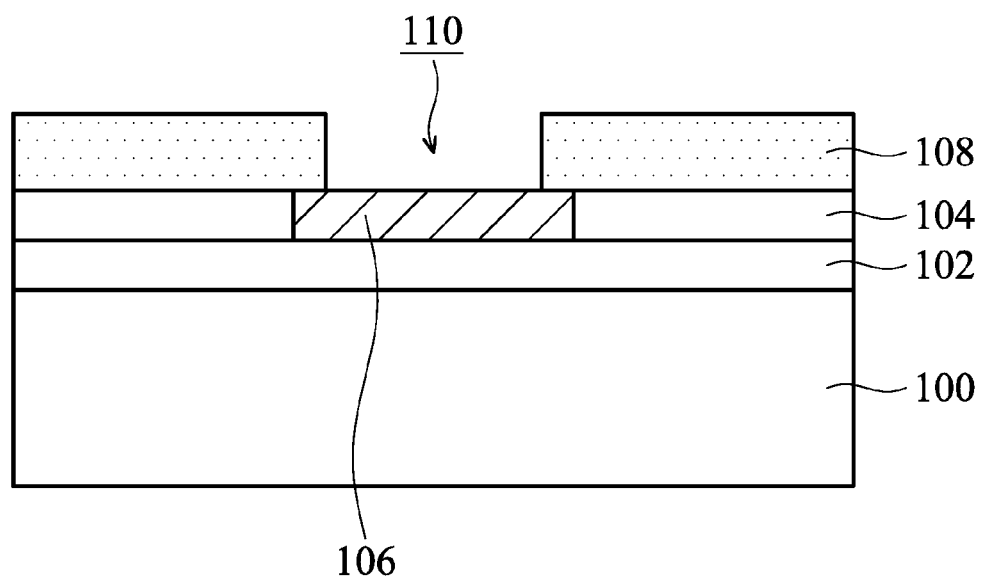

As shown in FIG. 1B, a recess 110 is formed in the dielectric layer 108 to expose the conductive feature 106, in accordance with some embodiments. In some embodiments, the recess 110 has a substantially circular top-view shape. In other words, the recess 106 has a substantially circular cross section taken along a plane that is parallel to the main surface of the semiconductor substrate 100. Many variations and modifications can be made to embodiments of the disclosure. In some other embodiments, the cross section (or top view) of the recess 110 is oval, substantially square, substantially rectangular, or substantially hexagonal. In some embodiments, the conductive feature 106 is wider than the recess 110, as shown in FIG. 1B.

In some embodiments, one or more photolithography operations and one or more etching operations are used to form the recess 110. The profile and/or shape of the recess 110 may be controlled by fine-tuning process conditions of the photolithography and etching operations. In some embodiments, a patterned photoresist layer (not shown) is formed directly on the dielectric layer 108 to assist in the formation of the recess 110. In some embodiments, there is no anti-reflection layer formed between the patterned photoresist layer and the dielectric layer 108. However, embodiments of the disclosure are not limited thereto. In some other embodiments, one or more anti-reflection layers are formed between the photoresist layer and the dielectric layer 108 to assist in the pattering of the formation of the recess 110.

Figure 1C:
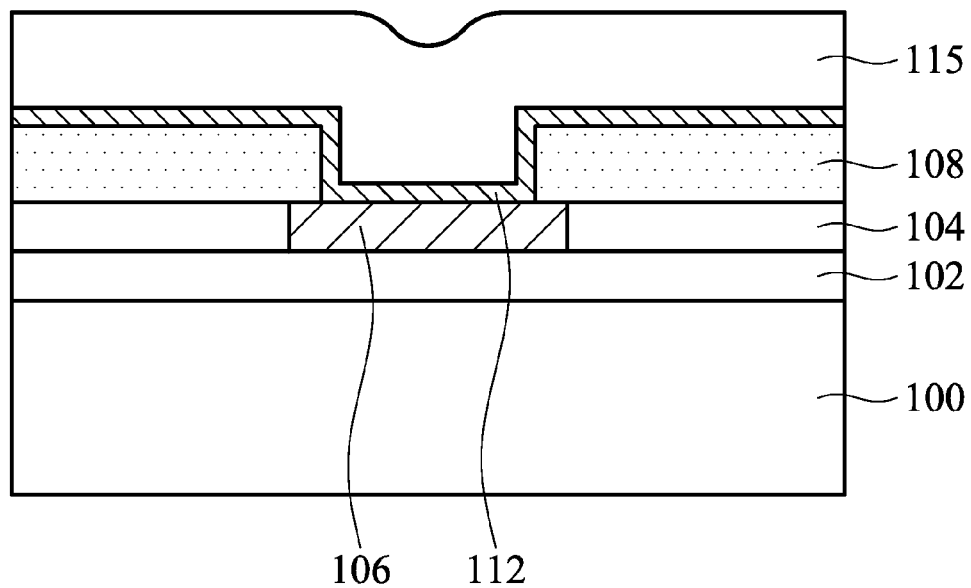

As shown in FIG. 1C, a conductive layer 112 is deposited over the dielectric layer 108 and the conductive feature 106, in accordance with some embodiments. In some embodiments, the conductive layer 112 is deposited conformally over the dielectric layer 108 and the conductive feature 106. The conductive layer 112 extends over a sidewall and the bottom of the recess 110, as shown in FIG. 1C. In some embodiments, the conductive layer 112 is in electrical contact with the conductive feature 106. In some embodiments, the conductive layer 112 is in direct contact with the conductive feature 106.

In some embodiments, the conductive layer 112 has a thickness that is in a range from about 100 Å to about 1000 Å. In some embodiments, the conductive layer 112 is a single layer. However, it should be appreciated that many variations and modifications can be made to embodiments of the disclosure. In some other embodiments, the conductive layer 112 is a multilayer structure that includes two or more sub-layers.

In some embodiments, the conductive layer 112 is made of titanium nitride, tantalum nitride, titanium, tantalum, platinum, aluminum copper, gold, tungsten, tungsten nitride, copper, another suitable conductive material, or a combination thereof. The conductive layer 112 may be deposited using a PVD process, a CVD process, an electroplating process, an electroless plating process, another applicable process, or a combination thereof.

Afterwards, a dielectric layer 115 is deposited over the conductive layer 112, as shown in FIG. 1C in accordance with some embodiments. In some embodiments, the dielectric layer 115 fills the recess 110 completely. In some embodiments, the dielectric layer 115 is made of a dielectric material that is substantially free of oxygen. In other words, the dielectric layer 115 contains substantially no oxygen. The dielectric layer 115 may be made of silicon nitride, silicon carbide, silicon carbon nitride, another suitable material, or a combination thereof. However, it should be appreciated that embodiments of the disclosure are not limited thereto. In some other embodiments, the dielectric layer 108 contains oxygen. For example, the dielectric layer 108 includes silicon oxide. In some embodiments, the dielectric layers 113 and 108 are made of different materials. In some other embodiments, the dielectric layers 113 and 108 are made of the same material. Various deposition methods may be used to deposit the dielectric layer 115. The dielectric layer 115 may be deposited using a CVD process, an ALD process, a spin-on process, a PVD process, a plating process, another applicable process, or a combination thereof.

Figure 1D:
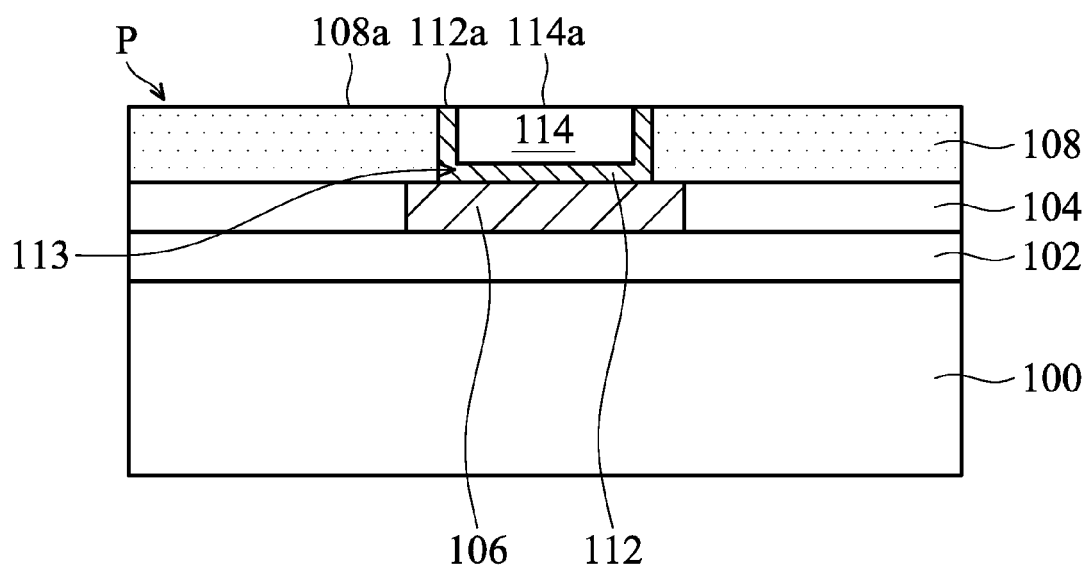

As shown in FIG. 1D, the portions of the dielectric layer 115 and the conductive layer 112, that are outside of the recess 110, are removed, in accordance with some embodiments. The remaining portion of the conductive layer 112 in the recess 110 forms an electrode 113. The remaining portion of the dielectric layer 115 forms a planarization layer (or a planarization element) 114. The dielectric layer 108 surrounds the electrode 113, and the electrode 113 surrounds the planarization layer 114.

In some embodiments, the removal of the dielectric layer 115 and the conductive layer 112 outside of the recess 110 is achieved using a planarization process. In some embodiments, a chemical mechanical polishing (CMP) process is used to partially remove the dielectric layer 115 and the conductive layer 112 such that the electrode 113 and the planarization layer are formed. The planarization process may include a CMP process, a grinding process, an etching process, another applicable process, or a combination thereof. In some embodiments, the dielectric layer 108 serves as a CMP stop layer during the CMP process.

As shown in FIG. 1D, the dielectric layer 108, the conductive layer 112 (or the electrode 113), and the planarization layer 114 have top surfaces 108a, 112a, and 114a, respectively. In some embodiments, due to the planarization process, the top surfaces 108a, 112a, and 114a together form a substantially planar surface (or plane) P.

In some embodiments, the electrode 113 has a ring-shaped top view or a ring-shaped cross section that is taken along a plane that is parallel to a main plane of the semiconductor substrate 100. The profile and shape of the electrode 113 may be determined by the profile and shape of the recess 110. FIGS. 2A-2E are top views of the structure shown in FIG. 1D, in accordance with some embodiments.

Figure 2A:
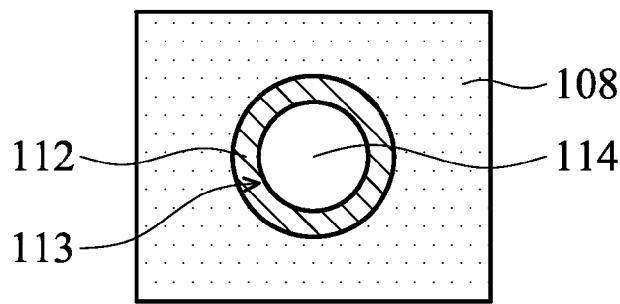
FIGS. 2A-2E are top views of the structure shown in FIG. 1D, in accordance with some embodiments.
Figure 2B:
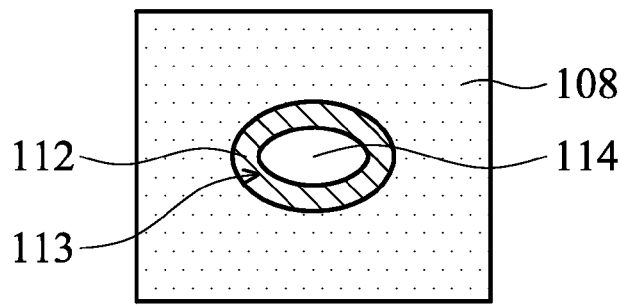
Figure 2C:
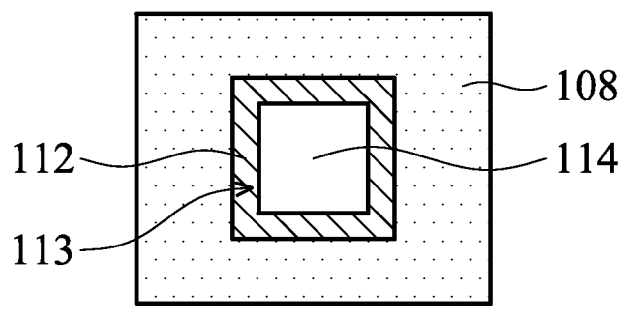
Figure 2D:
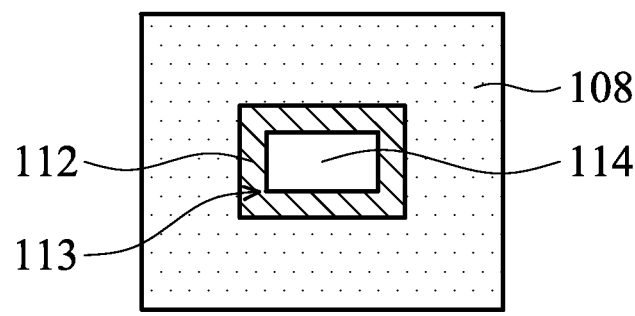
Figure 2E:
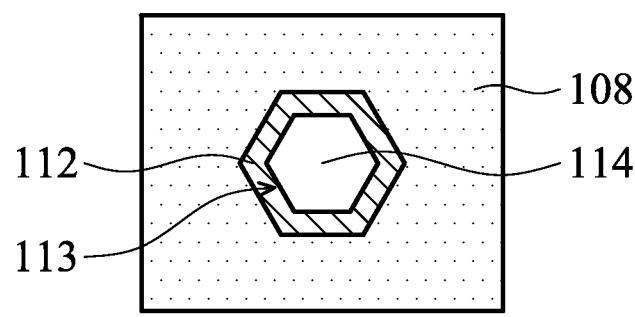

As shown in FIG. 2A, the electrode 113 has a ring-shaped cross section or a ring-shaped top view, in accordance with some embodiments. As shown in FIG. 2A, the cross section (or top view) of the electrode 113 is substantially circular. In some other embodiments, the electrode 113 has an oval cross section, as shown in FIG. 2B. If the recess 110 is formed to have an oval top-view, the electrode 113 may also have the oval top-view (or oval cross section) accordingly. As shown in FIG. 2C, the electrode 113 has a substantially square cross section, in accordance with some embodiments. In some other embodiments, the electrode 113 has a substantially rectangular cross section, as shown in FIG. 2D. As shown in FIG. 2E, the electrode 113 has a substantially hexagonal cross section, in accordance with some embodiments. By fine-tuning the profile and shape of the recess 110, the profile and shape of the electrode 113 may be controlled.

Figure 1E:
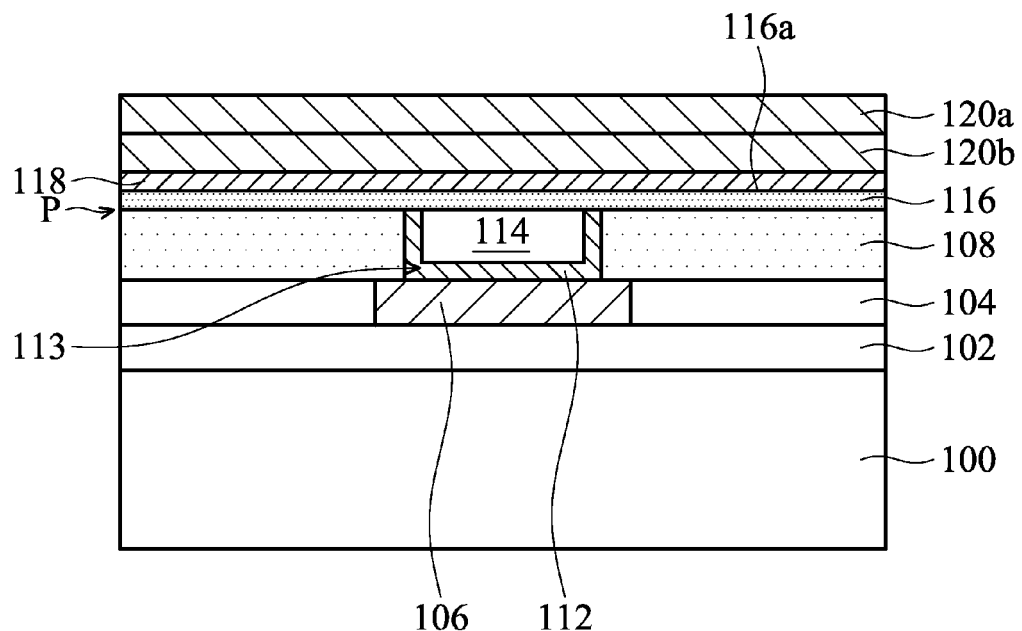

As shown in FIG. 1E, a resistance-switching layer 116 is deposited over the substantially planar surface (or plane) P formed by the dielectric layer 108, the electrode 113, and the planarization layer 114, in accordance with some embodiments. In some embodiments, the resistance-switching layer 116 is made of a dielectric material and is usually electrically insulating. In some embodiments, the material of the resistance-switching layer 116 includes hafnium oxide, aluminum oxide, tantalum oxide, zirconium oxide, another suitable material, or a combination thereof. In some embodiments, the resistance-switching layer 116 has a thickness that is in a range from about 5 Å to about 100 Å.

The resistance-switching layer 116 may increase its electrical conductivity after applying a sufficiently high voltage on it. The applied voltage may induce negatively charged ions (such as oxygen ions or nitrogen ions) in the resistance-switching layer 116 to move to the electrodes such that a series of vacancies are formed in the resistance-switching layer 116. These vacancies may form conductive paths. For example, through a forming process, one or more conductive paths (for example, conductive filaments) may be formed in the resistance-switching layer 116 so that the resistance of the resistance-switching layer 116 may be reduced significantly. Afterwards, a reverse voltage may be applied to partially destroy the formed conductive filaments or the conductive paths. As a result, the resistance of the resistance-switching layer 116 is increased. Therefore, the resistance of the resistance-switching layer 116 may be adjusted through the application of voltage. The data may be stored in the resistance-switching layer 116. By detecting the current passing through the resistance-switching layer 116, the resistance information of the resistance-switching layer 116 is obtained. Therefore, the stored data is also obtained.

Many methods may be used to form the resistance-switching layer 116. In some embodiments, the resistance-switching layer 116 is deposited using an ALD process, a CVD process, a PVD process, a spin-on process, a spraying coating process, another applicable process, or a combination thereof.

In some embodiments, the resistance-switching layer 116 is in direct contact with the electrode 113 and the planarization layer 114. In some embodiments, the resistance-switching layer 116 is also in direct contact with the dielectric layer 108. In some embodiments, since the dielectric layer 108 and the planarization layer 114 are substantially free of oxygen, the resistance-switching layer 116 is prevented from being negatively affected by oxygen ions. The quality and reliability of the resistance-switching layer 116 are therefore improved.

In some embodiments, due to the substantially planar surface (or plane) P provided by the dielectric layer 108, the electrode 113, and the planarization layer 114, the resistance-switching layer 116 has a substantially planar top surface 116a accordingly. In these cases, the top surface 116a of the resistance-switching layer 116 is substantially parallel to the top surfaces of the dielectric layer 108, the electrode 113, and the planarization layer 114.

Afterwards, a capping layer 118 is deposited over the resistance-switching layer 116, as shown in FIG. 1E in accordance with some embodiments. In some embodiments, the capping layer 118 is used to induce the formation of vacancies in the resistance-switching layer 116 during a subsequent forming process. Since the top surface 116a of the resistance-switching layer 116 is substantially planar, the deposited capping layer 118 is allowed to have a good adhesion to the resistance-switching layer 116.

In some embodiments, the capping layer 118 is made of titanium, platinum, ruthenium, another suitable material, or a combination thereof. In some embodiments, the capping layer 118 is deposited using a PVD process, a CVD process, an ALD process, a plating process, another applicable process, or a combination thereof. In some embodiments, the capping layer 118 has a thickness that is in a range from about 5 Å to about 100 Å. Many variations and modifications can be made to embodiments of the present disclosure. In some embodiments, the capping layer 118 is not formed.

Afterwards, one or more conductive layers are deposited over the capping layer 118, as shown in FIG. 1E in accordance with some embodiments. For example, conductive layers 120b and 120a are deposited sequentially over the capping layer 118, as shown in FIG. 1E. In some embodiments, the conductive layers 120b and 120a are made of titanium, tantalum, titanium nitride, tantalum nitride, platinum, aluminum copper, gold, tungsten, tungsten nitride, copper, another suitable conductive material, or a combination thereof. In some embodiments, the conductive layers 120b and 120a are made of the same conductive material. In some embodiments, the conductive layers 120b and 120a are made of different conductive materials. In some embodiments, the conductive layer 120b is made of tantalum nitride, and the conductive layer 120a is made of titanium nitride. In some embodiments, the performance of the semiconductor device structure is improved when the conductive layers 120b and 120a are a tantalum nitride layer and a titanium nitride layer, respectively.

Figure 1F:
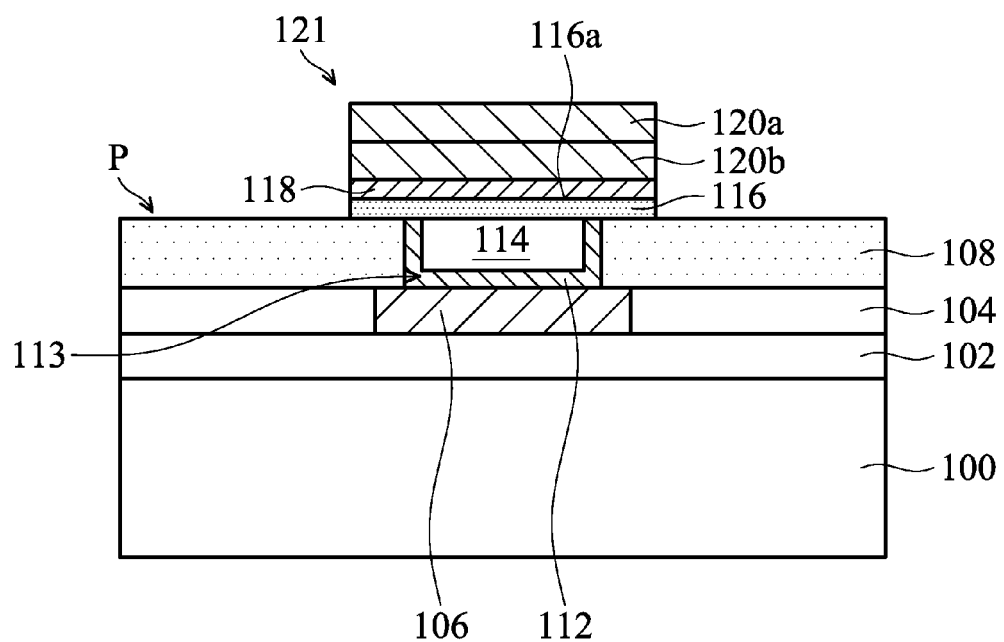

As shown in FIG. 1F, the resistance-switching layer 116, the capping layer 118, and the conductive layers 120b and 120a are patterned, in accordance with some embodiments. In some embodiments, one or more photolithography processes and one or more etching processes are used to pattern the resistance-switching layer 116, the capping layer 118, and the conductive layers 120b and 120a. After the patterning, the patterned conductive layers 120b and 120a together form an electrode 121. In some embodiments, one or all of the electrode 121, the capping layer 118, and the resistance-switching layer 116 is/are wider than the electrode 113. In some embodiments, sidewalls of the electrode 121, the capping layer 118, and the resistance-switching layer 116 are substantially coplanar, and all of them are wider than the electrode 113, as shown in FIG. 1F.

However, it should be appreciated that many variations and modifications may be made to embodiments of the present disclosure. In some other embodiments, one or all of the electrode 121, the capping layer 118, and the resistance-switching layer 116 is/are not wider than the electrode 113. In some embodiments, one or all of the electrode 121, the capping layer 118, and the resistance-switching layer 116 is/are as wide as the electrode 103.

In some embodiments, the electrodes 113 and 121 and the resistance-switching layer 116 together form a portion of a resistive random-access memory (RRAM) device. Due to the substantially planar surface P formed by the dielectric layer 108, the electrode 113, and the planarization layer 114, the resistance-switching layer 116 also has a substantially planar bottom surface and the substantially planar top surface 116a. Therefore, adhesion between the resistance-switching layer 116 and the underlying layers or the overlying layer is significantly enhanced. Defects are significantly prevented from forming in the resistance-switching layer 116. Electrical connection quality is also improved. The performance of the RRAM device may be improved.

Figure 1G:
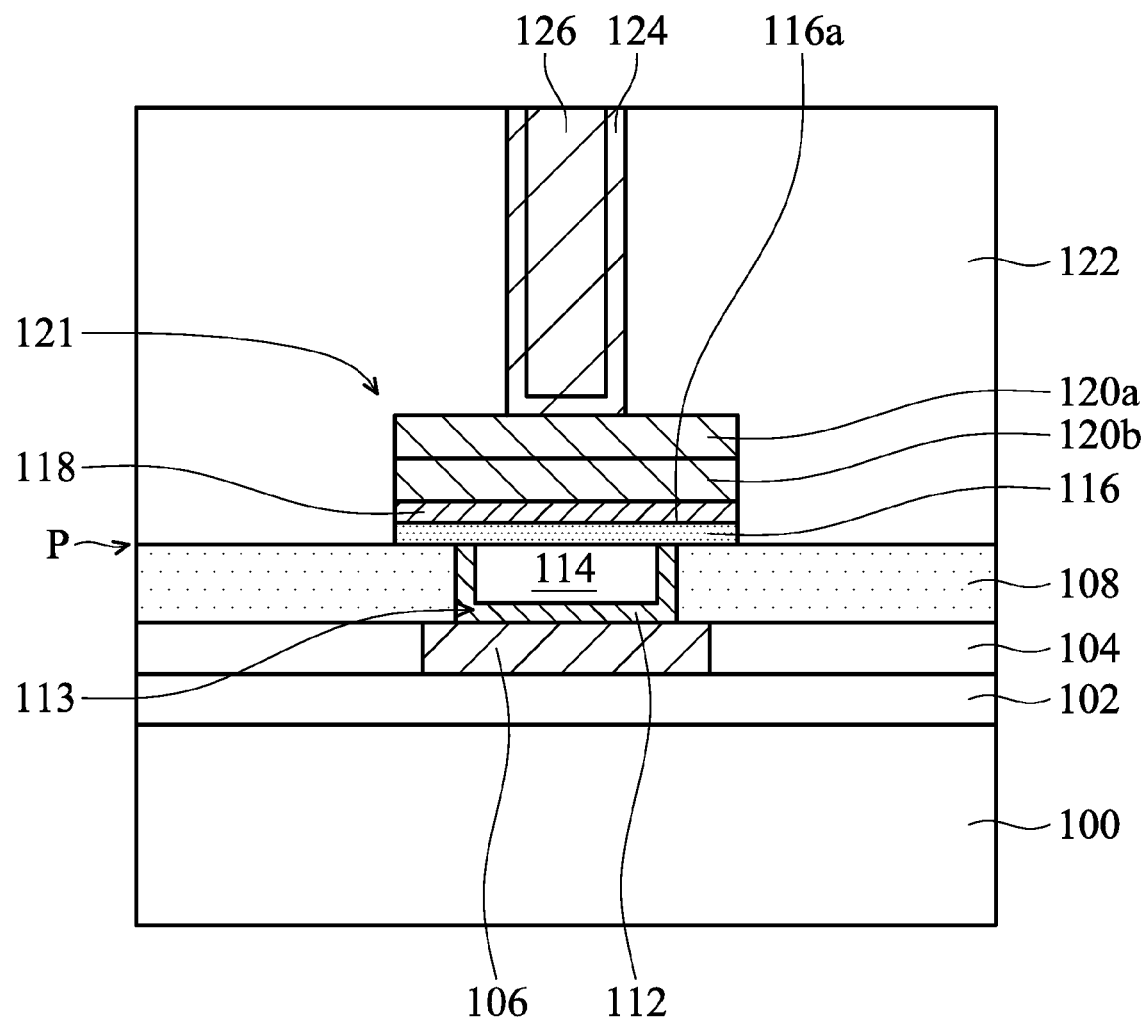

Afterwards, a dielectric layer 122 is deposited over the structure shown in FIG. 1F, as shown in FIG. 1G in accordance with some embodiments. In some embodiments, the dielectric layer 122 is made of a low-k dielectric material. The low-k dielectric material has a dielectric constant smaller than that of silicon dioxide. For example, the low-k dielectric material has a dielectric constant in a range from about 1.2 to about 3.5. As the density of a semiconductor device increases and the size of its circuit elements becomes smaller, the resistance capacitance (RC) delay time increasingly dominates circuit performance. Using a low-k dielectric material as the dielectric layer 122 is helpful in reducing the RC delay.

In some embodiments, the dielectric layer 122 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 122 includes a material including Si, C, O, or H. For example, the dielectric layer 122 includes $SiO_2$, SiOC, SiON, SiCOH, SiOCN, or a combination thereof. In some embodiments, the dielectric layer 122 includes fluorine-doped silicate glass (FSG) such as fluorine-doped —(O—Si$(CH_3)_2$—O)—. In some embodiments, the dielectric layer 122 is deposited using a CVD process, an atomic layer deposition (ALD) process, a spin-on process, a spray coating process, another applicable process, or a combination thereof.

In some embodiments, before the dielectric layer 122 is deposited, a protection layer (not shown) is formed over sidewalls of the resistance-switching layer 116. The protection layer may be used to prevent oxygen ions in the dielectric layer 122 from entering the resistance-switching layer 116. In some embodiments, the protection layer is made of a dielectric material that is substantially free of oxygen. In some embodiments, the protection layer is made of silicon carbide, silicon nitride, silicon carbon nitride, another suitable material, or a combination thereof.

Afterwards, a portion of the dielectric layer 122 is removed to form a via hole that exposes the electrode 121. One or more photolithography and etching processes may be used to form the via hole. A barrier layer 124 and a conductive material 126 may then be formed in the via hole to form a conductive via. The barrier layer 124 may be used to prevent metal ions in the conductive material 126 from diffusing into the dielectric layer 122. In some embodiments, the barrier layer 124 is made of titanium nitride, tantalum nitride, titanium, tungsten nitride, another suitable material, or a combination thereof. In some embodiments, the barrier layer 124 is deposited using a PVD process, a CVD process, an ALD process, an electroless plating process, another applicable process, or a combination thereof. Many variations and modifications can be made to embodiments of the disclosure. In some other embodiments, the barrier layer 124 is not formed.

In some embodiments, the conductive material 126 is made of copper, aluminum, tungsten, titanium, nickel, gold, platinum, another suitable conductive material, or a combination thereof. In some embodiments, the conductive material 126 is deposited using an electrochemical plating process, an electroless plating process, a PVD process, a CVD process, a spin-on process, another applicable process, or a combination thereof. In some embodiments, the electrode 121 also has a substantially planar top surface. Therefore, the adhesion, as well as the electrical connection quality between the conductive via and the electrode 121, are improved.

Embodiments of the disclosure form a semiconductor device structure including a resistance-switching layer. An electrode and a planarization are formed in a recess of a dielectric layer after a planarization process is performed. The electrode has a ring-shaped cross section. The planarization process provides a substantially planar surface for the resistance-switching layer to be deposited on. Adhesion between the resistance-switching layer and the electrode thereunder or an electrode to be formed thereon is significantly enhanced. Defects are significantly prevented from forming in the resistance-switching layer. The quality and reliability of the semiconductor device structure are greatly improved.

In accordance with some embodiments, a semiconductor device structure is provided. The semiconductor device structure includes a semiconductor substrate and a first electrode over the semiconductor substrate. The first electrode has a ring-shaped cross section. The semiconductor device structure also includes a resistance-switching layer over the first electrode and a second electrode over the resistance-switching layer.

In accordance with some embodiments, a semiconductor device structure is provided. The semiconductor device structure includes a semiconductor substrate and a first electrode over the semiconductor substrate. The semiconductor device structure also includes a planarization layer over the first electrode, and the planarization layer and the first electrode together form a substantially planar surface. The semiconductor device structure further includes a resistance-switching layer over the substantially planar surface. In addition, the semiconductor device structure includes a second electrode over the resistance-switching layer.

In accordance with some embodiments, a method for forming a semiconductor device structure is provided. The method includes forming a first electrode and a planarization layer over a semiconductor substrate. The first electrode and the planarization layer together form a substantially planar surface. The method also includes forming a resistance-switching layer over the first electrode and the planarization layer. The method further includes forming a second electrode over the resistance-switching layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a first electrode over the semiconductor substrate, wherein the first electrode has a ring-shaped cross section and surrounds a recess;
   a dielectric layer over the semiconductor substrate and outside of the recess;
   a planarization layer filled in the recess that is surrounded by the first electrode;
   a resistance-switching layer located above and in direct contact with the first electrode, the planarization layer and the dielectric layer, wherein the planarization layer and the dielectric layer are substantially free of oxygen; and
   a second electrode over the resistance-switching layer.

2. The semiconductor device structure as claimed in claim 1, wherein the dielectric layer is between the semiconductor substrate and the resistance-switching layer, wherein the dielectric layer has a recess, and the first electrode extends over a sidewall and a bottom of the recess such that the dielectric layer surrounds the sidewall of the first electrode.

3. The semiconductor device structure as claimed in claim 2, wherein the planarization layer is between the first electrode and the resistance-switching layer, wherein the planarization layer is separate from the dielectric layer by the sidewall of the first electrode.

4. The semiconductor device structure as claimed in claim 3, wherein the planarization layer is made of a dielectric material.

5. The semiconductor device structure as claimed in claim 1, wherein a bottom surface of the resistance-switching layer is in direct contact with the first electrode, the dielectric layer and the planarization layer.

6. The semiconductor device structure as claimed in claim 1, wherein top surfaces of the dielectric layer, the first electrode, and the planarization layer are substantially coplanar.

7. The semiconductor device structure as claimed in claim 6, wherein a top surface of the resistance-switching layer is substantially parallel to the top surfaces of the dielectric layer, the first electrode, and the planarization layer.

8. The semiconductor device structure as claimed in claim 1, wherein the first electrode is a single layer.

9. The semiconductor device structure as claimed in claim 1, wherein the second electrode comprises a tantalum nitride layer and a titanium nitride layer, and the tantalum nitride layer is between the titanium nitride layer and the resistance-switching layer.

10. The semiconductor device structure as claimed in claim 1, wherein at least one of the second electrode and the resistance-switching layer is wider than the first electrode.

11. A semiconductor device structure, comprising:
    a semiconductor substrate;
    a first electrode over the semiconductor substrate;
    a dielectric layer over the semiconductor substrate and surrounding the first electrode;
    a planarization layer over the first electrode, wherein the planarization layer, the dielectric layer and the first electrode together form a substantially planar surface;
    a resistance-switching layer over the substantially planar surface and in direct contact with the first electrode, the planarization layer and the dielectric layer, wherein the planarization layer and the dielectric layer are substantially free of oxygen; and
    a second electrode over the resistance-switching layer.

12. The semiconductor device structure as claimed in claim 11, wherein the planarization layer is made of a dielectric material.

13. The semiconductor device structure as claimed in claim 11, wherein the dielectric layer is between the semiconductor substrate and the resistance-switching layer.

14. The semiconductor device structure as claimed in claim 11, wherein a top surface of the resistance-switching layer is substantially parallel to the substantially planar surface formed by the planarization layer and the first electrode.

15. The semiconductor device structure as claimed in claim 11, wherein the resistance-switching layer is wider than the first electrode.

16. A method for forming a semiconductor device structure, comprising:
    forming a first electrode, a dielectric layer and a planarization layer over a semiconductor substrate, wherein the first electrode, a dielectric layer and the planarization layer together form a substantially planar surface, and the planarization layer and the dielectric layer are substantially free of oxygen;
    forming a resistance-switching layer over the substantially planar surface and in direct contact with the first electrode, the planarization layer and the dielectric layer; and
    forming a second electrode over the resistance-switching layer.

17. The method for forming a semiconductor device structure as claimed in claim 16, wherein the step of forming the first electrode, the dielectric layer and the planarization layer comprising:
    forming the dielectric layer over the semiconductor substrate;
    forming a recess in the dielectric layer;
    forming a conductive layer over the dielectric layer, wherein the conductive layer extends over a sidewall and a bottom of the recess;
    forming a second dielectric layer over the conductive layer to fill the recess; and
    removing the conductive layer and the second dielectric layer that are outside of the recess, wherein a remaining portion of the conductive layer in the recess forms the first electrode, and a remaining portion of the second dielectric layer forms the planarization layer.

18. The method for forming a semiconductor device structure as claimed in claim 17, wherein the removal of the conductive layer and the second dielectric layer that are outside of the recess is performed using a planarization process.

19. The method for forming a semiconductor device structure as claimed in claim 17, wherein a chemical mechanical polishing process is used to partially remove the conductive layer and the second dielectric layer such that the first electrode and the planarization layer are formed.

20. The method for forming a semiconductor device structure as claimed in claim 16, further comprising forming a capping layer over the resistance-switching layer before the second electrode is formed.

* * * * *